(12) United States Patent
Munding et al.

(10) Patent No.: US 9,123,735 B2
(45) Date of Patent: Sep. 1, 2015

(54) SEMICONDUCTOR DEVICE WITH COMBINED PASSIVE DEVICE ON CHIP BACK SIDE

(71) Applicant: Infineon Technologies Austria AG, Villach (AT)

(72) Inventors: Andreas Munding, Regensburg (DE); Martin Gruber, Schwandorf (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/955,587

(22) Filed: Jul. 31, 2013

(65) Prior Publication Data

US 2015/0034995 A1    Feb. 5, 2015

(51) Int. Cl.
| | |
|---|---|
| H01L 33/00 | (2010.01) |
| H01L 21/02 | (2006.01) |
| H01L 23/52 | (2006.01) |
| H01L 23/48 | (2006.01) |
| H01L 49/02 | (2006.01) |
| H01L 23/64 | (2006.01) |
| H01L 27/06 | (2006.01) |

(52) U.S. Cl.
CPC ............ *H01L 28/60* (2013.01); *H01L 23/642* (2013.01); *H01L 27/0629* (2013.01); *H01L 27/0694* (2013.01); *H01L 28/40* (2013.01); *H01L 2224/06181* (2013.01); *H01L 2924/1306* (2013.01); *H01L 2924/13091* (2013.01); *H01L 2924/14* (2013.01); *H01L 2924/1431* (2013.01); *H01L 2924/19103* (2013.01)

(58) Field of Classification Search
CPC ............ H01L 27/0605; H01L 29/7786; H01L 27/0629; H01L 29/1608; H01L 29/2003
USPC ............ 257/99, 666, 676, 691, 784, 59, 516, 257/924, 296, 707, 77, E27.016, 229, 275, 257/532, 690, 724, 737; 327/382; 438/50, 438/381
See application file for complete search history.

(56) References Cited

U.S. PATENT DOCUMENTS

| | | | | |
|---|---|---|---|---|
| 6,054,754 | A * | 4/2000 | Bissey | 257/666 |
| 6,373,127 | B1 | 4/2002 | Baudouin et al. | |
| 7,482,690 | B1 * | 1/2009 | Fan et al. | 257/724 |
| 8,368,084 | B2 | 2/2013 | Ikeda et al. | |
| 2002/0159243 | A1 * | 10/2002 | Ogawa et al. | 361/760 |
| 2008/0129143 | A1 * | 6/2008 | Cook et al. | 310/312 |
| 2009/0266588 | A1 * | 10/2009 | Inagaki et al. | 174/255 |
| 2013/0256834 | A1 * | 10/2013 | Tan et al. | 257/532 |

OTHER PUBLICATIONS

IPDIA—The 3D Silicon Leader, "EMSC—Embedded & Wirebound Silicon Capacitor," Revision 3.1, Mar. 1, 2012, 2 pp.

* cited by examiner

*Primary Examiner* — Long K Tran
*Assistant Examiner* — Dzung Tran
(74) *Attorney, Agent, or Firm* — Shumaker & Sieffert, P.A.

(57) ABSTRACT

Semiconductor chips are described that combine a semiconductor device and a capacitor onto a single substrate such that the semiconductor device and the capacitor are electrically isolated from each other. In one example, a semiconductor chip includes a substrate having a first side and a second side, wherein the second side is opposite the first side. The semiconductor chip further includes a semiconductor device formed on the first side of the substrate and an electrically insulating layer formed on at least a portion of the second side of the substrate. The semiconductor chip further includes a capacitor device formed on at least a portion of the electrically insulating layer on the second side of the substrate, wherein the capacitor device is electrically insulated from the semiconductor device.

16 Claims, 8 Drawing Sheets

SEMICONDUCTOR DEVICE WITH COMBINED PASSIVE DEVICE ON CHIP BACK SIDE

TECHNICAL FIELD

This disclosure is generally related to semiconductor devices, and more particularly to semiconductor devices combined with, and electrically isolated from, passive devices.

BACKGROUND

An electric device typically has a passive device such as a capacitor or an inductor as part of an electronic device package. The passive device may be a separate device or may be combined with an active device on a chip. Conventional chips having more than one device are often limited to vertically unstructured devices and are often used in applications such as high frequency devices and low power logic devices.

SUMMARY

In general, this disclosure describes semiconductor devices that include one or more passive devices onto a back side of a substrate. For example, a semiconductor chip is described which includes a semiconductor device and a capacitor formed on a single substrate such that the semiconductor device and the capacitor are electrically isolated from each other. For example, a semiconductor chip includes a semiconductor device formed on a first side of a substrate and an electrically insulating layer formed on at least a portion of a back second side of the substrate. The semiconductor chip may include one or more passive devices formed on a back side of the substrate.

The details of one or more examples and techniques of this disclosure are set forth in the accompanying drawings and the description below. Other features, objects, and advantages of the disclosure will be apparent from the description and drawings, and from the claims.

Figure 1:
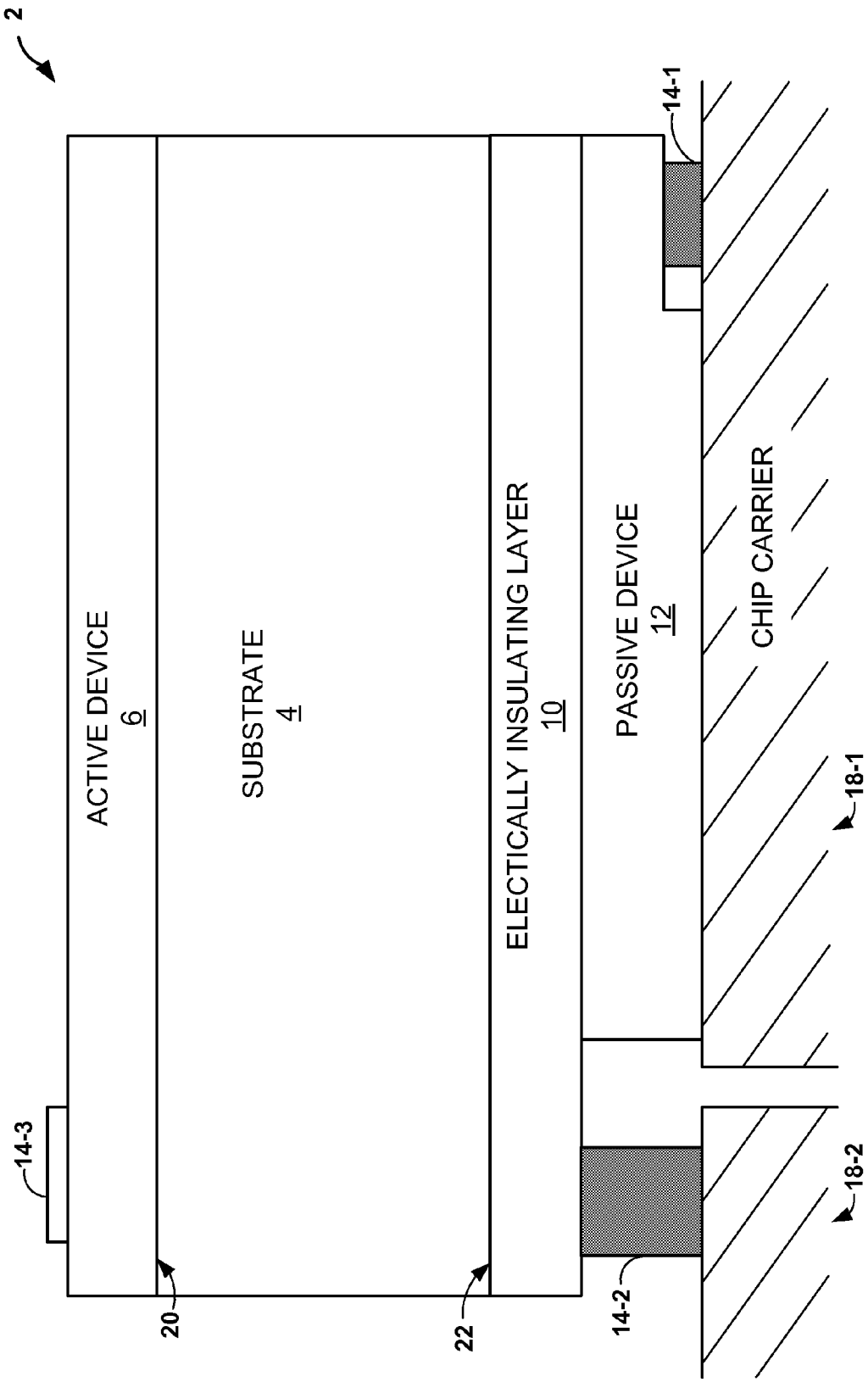
FIG. 1 is a block diagram illustrating an example semiconductor chip including a passive device formed on a back side of the chip without vertical current flow, in accordance with one or more techniques described in this disclosure.

The drawings are not necessarily drawn to scale.

DETAILED DESCRIPTION

This disclosure describes a single semiconductor chip having one or more active devices and one or more passive devices formed on a substrate such that the active devices and the passive devices are electrically isolated from each other unless otherwise electrically connected. An active device may be formed on at least a front side of a substrate, while a passive device is formed on a back side of the substrate that is at least partially unused by the active device. In this way, the devices may be incorporated in a single chip package, which may be used as part of an integrated circuit. Examples and techniques described in this disclosure further extend the use of a chip back side to active devices that have vertically structured metal, dielectric, and metal layers.

Active devices may be, for example, logic devices, semiconductor devices including field effect transistors (FETs), light emitting diodes (LEDs), or other electronic devices. An active device may be a component of an integrated circuit of an electronic device. Passive devices may be, for example, capacitors, inductors, and resistors. A passive device may be electrically isolated from the active device (e.g., the ground potentials of the passive device and the active device may be different). For semiconductor devices that also include capacitors, structures described in this disclosure may increase area capacitance of the capacitors.

Example semiconductor chips described in this disclosure provide for direct access to a chip back side electrode. Direct access to the back side electrode enables connection to the electrode without electrically involving the substrate to which the electrode is attached. Direct access to the back side electrode prevents the resistance of the substrate from being in series with the active device, thus reducing parasitic resistance.

As described herein, active devices and passive devices may be formed in one assembly step. Integrating capacitors, inductors, or resistors on the back side of a chip with an active device may provide the function of a filter or buffer into the chip without adding additional assembly steps. Further, semiconductor chips structured in accordance with this disclosure may have higher power per volume (e.g., kilowatt/cubic centimeters ($kW/cm^3$)) and higher power per weight (e.g., kilowatt/gram (kW/g)) ratios than could be achieved with two separate chips. Moreover, the semiconductor devices described in this disclosure may be used for power devices.

Integrating two or more devices into a single chip package decreases cost, reduces the number of assembly steps, and reduces the number of separate chips required for an electronic device. Combining a passive device on the back side of a chip reduces cost over non-combined devices because the combined device uses back side processing which is cheaper than the more expensive front side processing. Because two or more devices are integrated in a single chip, fewer devices need to be manufactured and assembled than if separate devices were used. Thus, cost is reduced in manufacturing, storage, assembly, and other aspects of creating and using semiconductor devices.

Furthermore, structures described in this disclosure may combine passive devices on the back side of a microchip having a vertical current structure, such as a vertical FET. The active devices may have vertically structured metal, dielectric, and metal layers.

For purposes of illustration, the semiconductor chips described in this disclosure are described with respect to a capacitor being the passive device. However, the semiconductor chips described in this disclosure are not so limited and can be extended to other types of electric devices. Also, the active devices described in this disclosure are not limited to FETs, LEDs, integrated circuit devices, and any type of active device that can be formed on a front side of a substrate or have a vertical structure of the substrate may be utilized.

FIG. 1 is a block diagram illustrating an example chip 2 including a passive device 12 formed on a back side of chip 2 without vertical current flow, in accordance with one or more techniques described in this disclosure. Chip 2 includes a substrate 4 that has a front side 20 and a back side 22. As used herein, the phrase "front side of a chip" refers to, for example, anything that has been formed on front side 20 of substrate 4, which may or may not be directly formed on front side 20. Front side 20 may also be referred to as an "active surface" of chip 2. The phrase "back side of a chip" refers to, for example, anything that has been formed on back side 22 of substrate 4, which may or may not be directly formed on back side 22. As used herein, the phrase "vertical current flow" refers to any current that flows between front side 20 and back side 22, or vice-versa, and does not necessarily refer to an orientation of chip 2.

Chip 2 may comprise a semiconductor chip and may include an active device 6 formed on front side 20 of substrate 4. Examples of active devices 6 include any device that does not have vertical current flow, including logic devices and integrated circuit devices. Examples of substrate 4 include any material on which active device 6 may be formed, including silicon.

In the example of FIG. 1, chip 2 includes an electrically insulating layer 10 formed on back side 22 of substrate 4. Electrically insulating layer 10 may be formed directly on back side 22 or there may be intervening layers between electrically insulating layer 10 and back side 22. Electrically insulating layer 10 acts as an isolation barrier between active device 6 and passive device 12 such that there is no direct current path from active device 6 to passive device 12 through substrate 4. In this manner, passive device 12 and active device 6 may be independent of each other. Passive device 12 is electrically isolated from anything formed on front side 20 of chip 2.

Passive device 12 may be formed on at least a portion of electrically insulating layer 10. Examples of passive device 12 include a capacitor, a resistor, and an inductor. Passive device 12 may be formed of one or more layers, as described in detail below. Integrating passive device 12 on back side 22 of chip 2 reduces the cost of manufacturing and assembling two separate devices having the functionality of active device 6 and passive device 12. Manufacturing chip 2 according to techniques described herein result in a smaller, more versatile, cheaper, and more compact chip than having multiple separate chips.

Chip 2 may include three or more separate electrodes 14-1, 14-2, and 14-3 (collectively referred to as "electrodes 14"). Electrodes 14 are electrically independent of each other. Electrode 14-1 is electrically coupled to passive device 12. Electrode 14-2 is affixed to electrically insulating layer 10. In the example of FIG. 1, electrode 14-2 is independent of passive device 12 and active device 6, but in other examples, electrode 14-2 may be electrically coupled to one or the other. Electrode 14-3 is electrically coupled to active device 6. In some examples, chip 2 includes more or less electrodes than is illustrated in FIG. 1.

FIG. 1 illustrates chip 2 including two parts of a chip carrier, first portion of chip carrier 18-1 and second portion of chip carrier 18-2 (referred to collectively as "chip carrier 18"). Chip carrier 18 may be formed of an electrically conductive material, for example, a metal. First portion of chip carrier 18-1 is affixed or otherwise attached to passive device 12 and electrode 14-1. Second portion of chip carrier 18-2 is affixed or otherwise attached to electrode 14-2. In some examples, first portion of chip carrier 18-1 and second portion of chip carrier 18-2 are electrically isolated from each other. That is, first portion of chip carrier 18-1 and second portion of chip carrier 18-2 are at different potential. Chip carrier 18 may be designed such that it corresponds to the connection points of passive device 12, such as electrodes 14. Thus, passive device 12 is electrically accessed through chip carrier 18.

There may be various ways in which to provide voltage to active device 6. As one example, an external power source may be electrically connected to active device 6. In one example, passive device 12 may provide power to active device 6. As another example, passive device 12 may be a capacitor that provides voltage to active device 6 when charged. In that example, passive device 12 is electrically connected to active device 6 via external connections, such as wiring or printed circuit board (PCB) traces between electrodes 14-1 and 14-3.

With the structure illustrated in FIG. 1, chip 2 may combine two or more devices 6 and 12 together on a single substrate 4. Chip 2 potentially reduces the number of separate devices required for an electronic device and reduces the cost over separate devices in manufacturing, storage, and assembly. Furthermore, the structure of chip 2 provides for direct access to back side electrode 14-1.

Figure 2A:
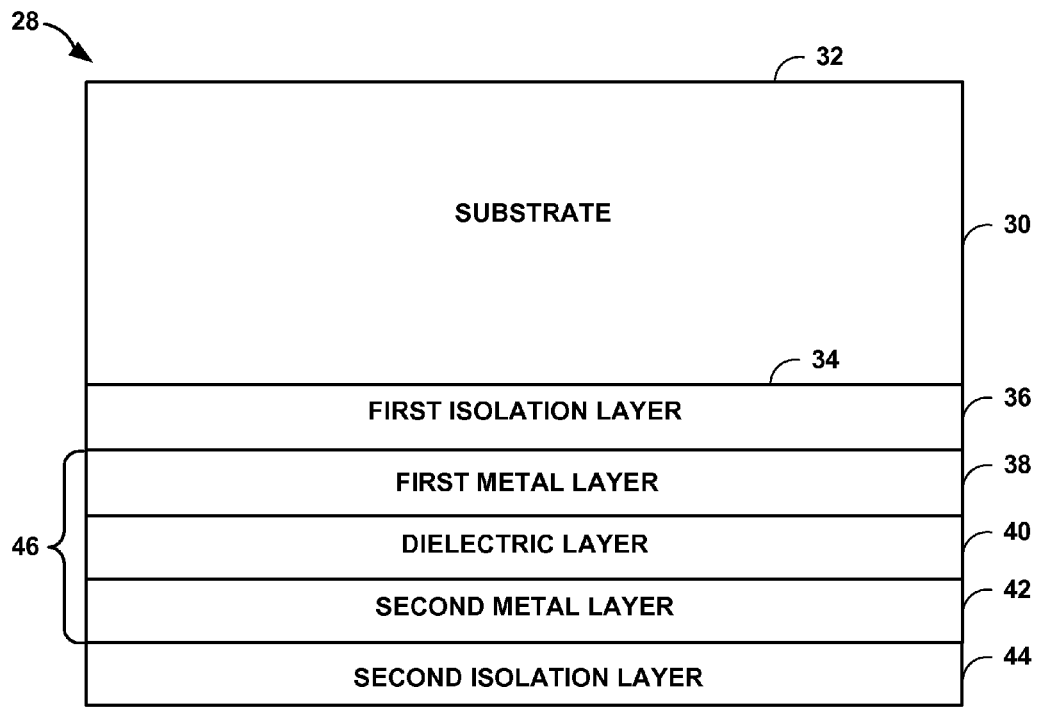
FIGS. 2A and 2B are block diagrams illustrating example capacitor structures on a back side of a chip, in accordance with one or more techniques described in this disclosure.
Figure 2B:
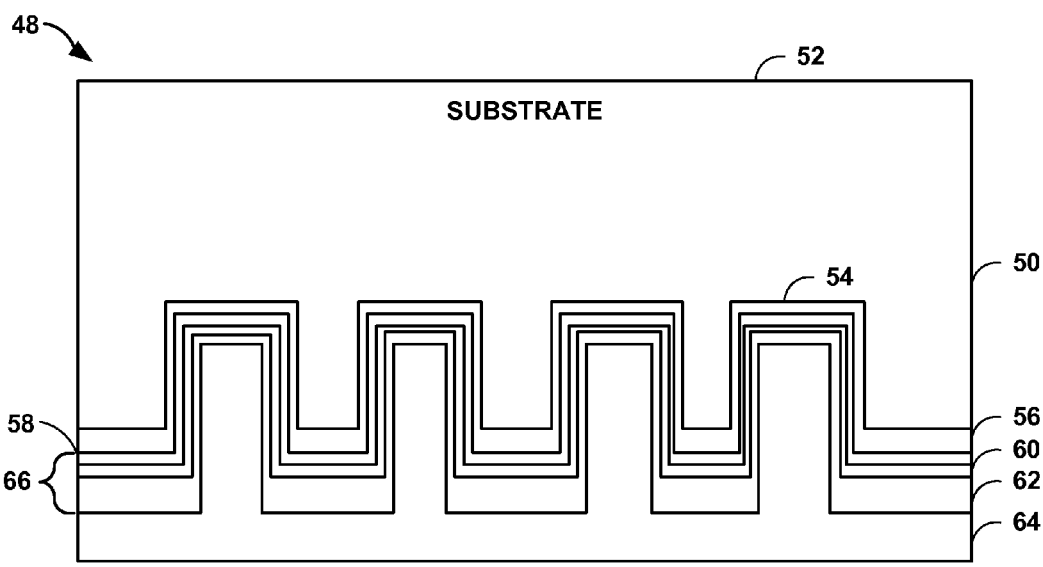

FIGS. 2A and 2B are block diagrams illustrating example capacitors formed on a back side of a substrate, in accordance with one or more techniques described in this disclosure. FIG. 2A illustrates a chip 28 including a capacitor 46 having a planar structure formed on a back side 34 of a substrate 30. FIG. 2B illustrates a chip 48 including a capacitor 66 having a trench structure formed on a back side 54 of a substrate 60. Chips 28 and 48 may include features the same as, or similar to, chip 2 of FIG. 1. In some examples, chips 28 and 48 include different features than chip 2 of FIG. 1.

In FIG. 2A, chip 28 includes substrate 30 which has a front side 32 and back side 34, such that front side 32 is opposite back side 34. Substrate 30 may be a silicon substrate and may have a thickness of approximately 20 micrometers (µm) to approximately 700 µm, although other thicknesses are possible. Substrate 30 may have one or more active devices formed on front side 32, such as FETs, LEDs, or other integrated circuit devices. A first isolation layer 36 is formed on at least a portion of back side 34 of substrate 32. First isolation layer 36 may be an electrically insulating layer, such that any device formed on first isolation layer 36 will be electrically independent of any device formed on front side 32. Examples of first isolation layer 36 include an oxide layer, such as any material with the chemical composition of $SiO_x$ or $SiN_x$. Other examples of first isolation layer 36 include any electrically isolating organic material or polymer. Isolation layer 36 may be formed with a thickness suitable to provide electric isolation between capacitor 46 and substrate 30 for the particular application for which chip 28 is going to be used. Example thicknesses of isolation layer 36 include approximately 50 nanometers (nm) to about approximately 2000 nm. In some examples, the thicknesses of the layers described herein may not be uniform over the entire layer.

Capacitor 46 is formed on isolation layer 34 and includes a first metal layer 38, a dielectric layer 40, and a second metal layer 42. First metal layer 38, which may act as a top plate of capacitor 46, is formed on at least a portion of isolation layer 34. Dielectric layer 40 is formed on at least a portion of first metal layer 38. Second metal layer 42 is formed on at least a portion of dielectric layer 40. Layer 38, 40, and 42 may be any materials and thicknesses suitable for a capacitor. For example, dielectric layer 40 may be any dielectric material, including those with a relatively high dielectric constant (κ) dielectric material, such as for example, silicon nitride ($Si_3N_4$), aluminum oxide ($Al_2O_3$), yttrium oxide ($Y_2O_3$), zirconium dioxide ($ZrO_2$), hafnium oxide ($HfO_2$), lanthanum oxide ($La_2O_3$), tantalum pentoxide ($Ta_2O_5$), and titanium dioxide ($TiO_2$). Dielectric layer 40 may have a thickness in the range of approximately 1 nm to 100 nm.

First metal layer 38 and second metal layer 42 may be any metal or metal alloy that can be deposited by, for example, sputtering, evaporation, chemical vapor deposition, or plating. Such metals may include aluminum (Al), copper (Cu), aluminum copper (AlCu), aluminum silicon copper (AlSiCu), titanium (Ti), tungsten (W), titanium tungsten (TiW), and gold (Au). First metal layer 38 and second metal layer 42 may each have thicknesses in the range of approximately 10 nm to approximately 1000 nm. Further, layer 38, 40, and 42 may be formed horizontally.

A second isolation layer 44 may be formed on at least a portion of second metal layer 42. Second isolation layer 44 may electrically or thermally isolate capacitor 46 from a chip carrier or lead frame to which chip 28 is attached. In some examples, second isolation layer 44 is similar to first isolation layer 36 in composition and structure.

Layers 36, 38, 40, 42, and 44 may be formed using deposition techniques such as sputtering, physical vapor deposition (PVD), chemical vapor deposition (CVD), electrochemical deposition (ECD), molecular beam epitaxy (MBE), atomic layer deposition (ALD), or any other technique for constructing layers in semiconductor device fabrication.

FIG. 2B illustrates example chip 48 including capacitor 66 having a trench structure. Similar to chip 28 of FIG. 2A, chip 48 includes a substrate 50 having a front side 52 and a back side 54 opposite front side 52. Chip 48 further includes a first isolation layer 56 formed on at least a portion of back side 54 of substrate 50. Chip 48 includes capacitor 66 which includes a first metal layer 58 formed on at least a portion of first isolation layer 56, a dielectric layer 60 formed on at least a portion of first metal layer 58, and a second metal layer 62 formed on at least a portion of dielectric layer 60. A second isolation layer 64 has been formed on at least a portion of second metal layer 62. In some examples, capacitor 66 may be thought of as further including isolation layers 56 and 64.

The compositions of the layers 56, 58, 60, 62, and 64 may be the same as, or different from, the corresponding layers 36, 38, 40, 42, and 44 of FIG. 2A. However, the layers 54, 56, 58, 60, 62, and 64 have a trench structure. All other things being equal, capacitor 66 which has the trench layer structure shown in FIG. 2B may result in greater area capacitance than capacitor 46 having the planar layer structure shown in FIG. 2A.

One example process for creating a trench layer structure is as follows. First, trenches are etched into substrate 50 using a trenching process, such as lithography, a anisotropic etching process, a dry etching process, or the like. Next, the trenches are filled with an oxide layer to create first isolation layer 56. Some of first isolation layer 56 is etched away to keep the trench structure. Then, the layers 58, 60, and 62 of capacitor 66 are formed approximately conformally using sputtering techniques, for example, along a sidewall of first isolation layer 56 within the trenches. Finally, second isolation layer 64 is deposited which may fill the trenches.

FIGS. 2A and 2B illustrate capacitors 46 and 66 having a metal-insulator-metal (MIM) structure. However, in other examples, capacitors 46 and 66 may have different structures, such as, for example, a poly-insulator-poly (PIP) structure or a metal-oxide-silicon (MOS) structure.

Figure 3:
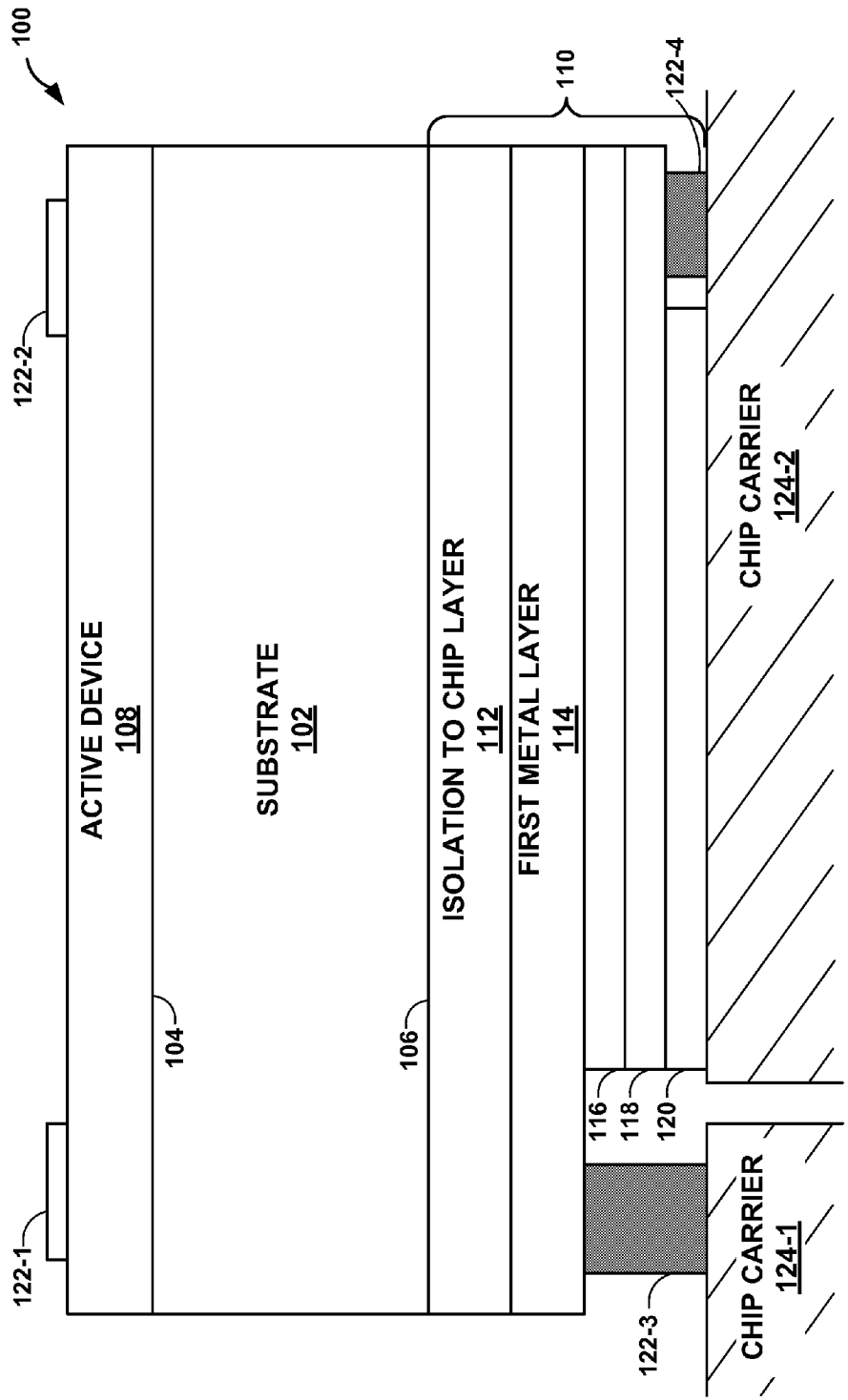
FIG. 3 is a block diagram illustrating an example semiconductor chip including a capacitor formed on a back side without vertical current flow, in accordance with one or more techniques described in this disclosure.

FIG. 3 is a block diagram illustrating an example semiconductor chip 100 including a capacitor 110 formed on a back side 106 without vertical current flow, in accordance with one or more techniques described in this disclosure. FIG. 3 shows a cross-sectional view of chip 100. Chip 100 includes a substrate 102 that has a front side 104 and a back side 106 opposite front side 104. Examples of substrate 102 include any material on which active device 108 may be formed on, including silicon. Chip 100 includes an active device 108 formed on front side 104 of substrate 104 and capacitor 110 formed on back side 106 of substrate 104. Examples of active devices 108 include any device that does not have vertical current flow through substrate 102, including integrated circuit devices.

In the example of FIG. 1, chip 100 includes an isolation to chip layer 112 formed on back side 106 of substrate 102. Isolation to chip layer 112 is an electrically insulating layer and may be formed directly on back side 106 or there may be intervening layers between it and back side 106. Isolation to chip layer 112 acts as an isolation barrier between active device 108 and capacitor 110 such that there is no direct current path from active device 108 to capacitor 110. In this manner, capacitor 110 and active device 108 may be independent of each other. Thus, capacitor 110 is electrically isolated from anything formed on front side 104 of substrate 102.

Capacitor 110 is formed on at least a portion of back side 106 of substrate 102. As shown in FIG. 3, capacitor 110 has a planar stack layer structure similar to that shown in FIG. 2A. However, in other examples, capacitor 110 may have a different structure, such as the trench stack structure shown in FIG. 2B. A first metal layer 114 is formed on at least a portion of isolation to chip layer 112. A dielectric layer 116 is formed on at least a portion of first metal layer 114. A second metal layer 118 is formed on at least a portion of dielectric layer 116. A second isolation layer 120 is formed on at least a portion of second metal layer 118.

Chip 100 includes four separate electrodes 122-1, 122-2, 122-3, and 122-4 (collectively referred to as "electrodes 122"). Some of electrodes 122 may be electrically independent of each other. Electrodes 122-1 and 122-2 are electrically coupled to active device 108. Electrode 122-3 is formed on at least a portion of first metal layer 114 and provides an electrical connection to a first plate (e.g., top plate) of capacitor 110. Similarly, electrode 122-4 is formed on at least a portion of second metal layer 118 and provides an electrical connection to a second plate (e.g., bottom plate) of capacitor 110. In the example of FIG. 3, electrodes 122-1 and 122-2 are electrically independent of capacitor 110 and electrodes 122-3 and 122-4 are electrically independent of active device 108. In other examples, chip 100 includes more or less electrodes than is illustrated in FIG. 3. Further, in other examples, electrodes 122 may be bonded and electrically coupled to different features or layers of chip 100.

FIG. 3 illustrates chip 100 including two portions of a chip carrier, first portion of chip carrier 124-1 and second portion of chip carrier 124-2 (referred to collectively as "chip carrier 124"). First portion of chip carrier 124-1 is affixed or otherwise attached to electrode 122-3. Second portion of chip carrier 124-2 is affixed or otherwise attached to electrode 122-4. First portion of chip carrier 124-1 and second portion of chip carrier 124-2 may be electrically isolated from each other. Chip carrier 124 may be an electrical conductor. Electrical connection to capacitor 110 may be made through first portion of chip carrier 124-1 and second portion of chip carrier 124-2. Such a structure enables easy and direct access to capacitor 110, which is on back side 106 of chip 100. Connections to chip carrier 124 may be made with, for example, conductive glue or solder connections. In other examples, other attachment mechanisms or techniques are used. In other examples, a lead frame is attached to capacitor 66 instead of chip carrier 124.

In other examples where the passive device, such as passive device 12 of FIG. 1, is a resistor or an inductor, some of the electrodes described herein may be electrically coupled to a first and a second end of the resistor or inductor, respectively.

Figure 4:
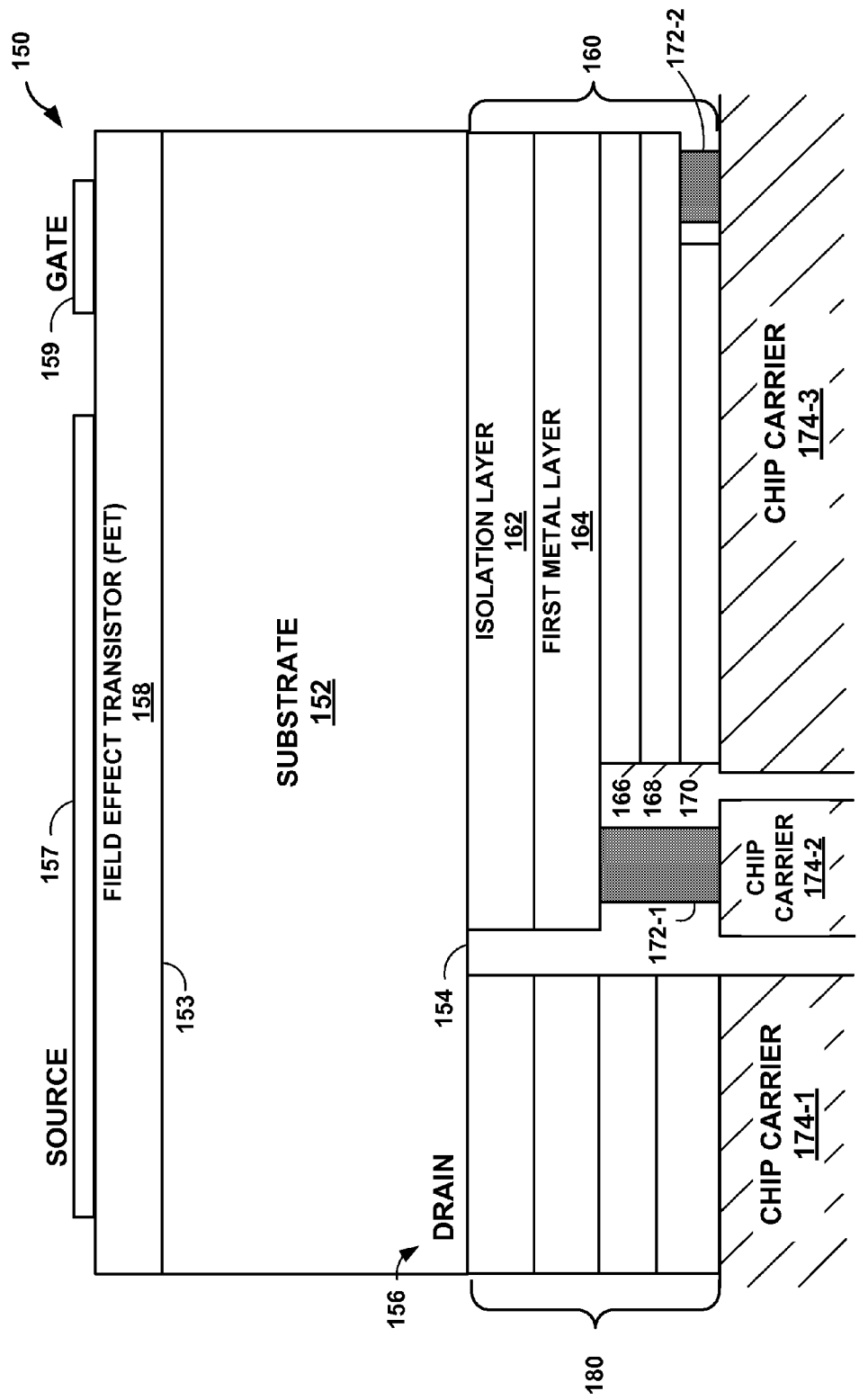
FIG. 4 is a block diagram illustrating an example semiconductor device having vertical current flow and a capacitor formed on a back side, in accordance with one or more techniques described in this disclosure.

FIG. 4 is a block diagram illustrating an example semiconductor device 150 having vertical current flow and a capacitor 160 formed on a back side, in accordance with one or more techniques described in this disclosure. FIG. 4 shows a cross-sectional view of semiconductor device 150. Semiconductor device 150 may be used in power applications because it can carry a relatively large current.

Semiconductor device 150 includes a substrate 152 that has a first side 153 and a second side 154 opposite first side 153. First side 153 and second side 154 may also be referred to as "front side" and "back side," respectively. Examples of substrate 152 include any material on which active device 108 may be formed on, including silicon (Si) and gallium nitride (GaN).

Semiconductor device 150 includes a field effect transistor (FET) 158 formed on first side 154 of substrate 152. FET 158 is an active device of semiconductor device 150. FET 158 may be any type of vertical transistor, including a metal-oxide-semiconductor FET (MOSFET), a junction FET (JFET), or an ion-sensitive FET (ISFET), for example. In other examples, FET 158 is another type of active device, such as a diode, bipolar junction transistor (BJT), complementary metal-oxide-semiconductor (CMOS) device, or the like. Furthermore, semiconductor device 150 may include GaN based switch devices.

Active device 158 includes a source 157, a gate 159, and a drain 156. Current may flow between source 157 and drain 156, in either direction, depending on, for example, the functionality and type of FET 158. FET 158 may include one or more layers and have various structures as known in the art. The functionality of FET 158 is more on the left side of semiconductor device 150, because a channel is open between source 157 and drain 156 for current to flow. Current typically does not flow between source 157 and isolation layer 162. In these examples, the area of drain 156 is large enough not to adversely affect performance of semiconductor device 150.

Semiconductor device 150 includes capacitor 160 formed on at least a portion of second side 154 of substrate 152. Capacitor 160 includes an isolation layer 162 formed on at least a portion of second side 154 of substrate 152. Isolation layer 162 is an electrically insulating layer and may be formed directly on second side 154 or there may be intervening layers between isolation layer 162 and second side 154. Electrically isolation layer 162 functions as an isolation barrier between FET 158 and capacitor 160 such that there is no direct current path between FET 158 and capacitor 160. In this manner, capacitor 160 and FET 158 may be independent of each other. Thus, capacitor 160 is electrically isolated from anything formed on first side 153 of substrate 152. While the left side of semiconductor device 150 includes the functionality of FET 158, the right side of semiconductor device 150 is electrically isolated from capacitor 160 due to isolation layer 162.

As shown in FIG. 4, capacitor 160 has a planar stack layer structure similar to that shown in FIG. 2A. However, in other examples, capacitor 160 may have a different structure, such as the trench stack structure shown in FIG. 2B. A first metal layer 164 is formed on at least a portion of isolation layer 162. A dielectric layer 166 is formed on at least a portion of first metal layer 164. A second metal layer 168 is formed on at least a portion of dielectric layer 166. A second isolation layer 170 is formed on at least a portion of second metal layer 168.

Two electrodes 172-1 and 172-2 are electrically coupled to capacitor 160. Electrode 172-1 is formed on at least a portion of first metal layer 164, and provides an electrical connection to a first or top plate of capacitor 160. Similarly, electrode 172-2 is formed on at least a portion of second metal layer 168, and provides an electrical connection to a second plate of capacitor 160. In the example of FIG. 4, electrodes 172-1 and 172-2 are electrically independent of source 157, drain 156, and gate 159 of FET 158. In other examples, chip 150 includes more or less electrodes than is illustrated in FIG. 4. Further, in other examples, electrodes 172-1 and 172-2 may be bonded to and electrically coupled with different features or layers of semiconductor device 150.

Semiconductor device 150 includes three portions of a chip carrier, first portion 174-1, second portion 174-2, and third portion 174-3 (referred to collectively as "chip carrier 174"). First portion of chip carrier 174-1 is affixed or otherwise attached to electrode drain 156. However, structure 180 may be disposed between drain 156 and first portion of chip carrier 174-1. In some examples, structure 180 is part of drain 156. Structure 180 may include one or more layers, such as one or more oxide layers, one or more metal layers, and other types of layers.

Second portion of chip carrier 174-2 is affixed or otherwise attached to electrode 172-1. Third portion of chip carrier 174-3 is affixed or otherwise attached to electrode 172-2. First portion of chip carrier 174-1 may be electrically isolated from second portion of chip carrier 174-2 and third portion of chip carrier 174-3. Moreover, second portion of chip carrier 174-2 and third portion of chip carrier 174-3 may be electrically isolated from one another. Chip carrier 124 may be an electrical conductor. Electrical connection to capacitor 110 may be made through second portion of chip carrier 174-2 and third portion of chip carrier 174-3. Such a structure enables easy and direct access to capacitor 160, which is on second side 154 of semiconductor device 150. Connections to chip carrier 174 may be made with, for example, conductive glue or solder connections. In other examples, other attachment mechanisms or techniques are used.

Figure 5:
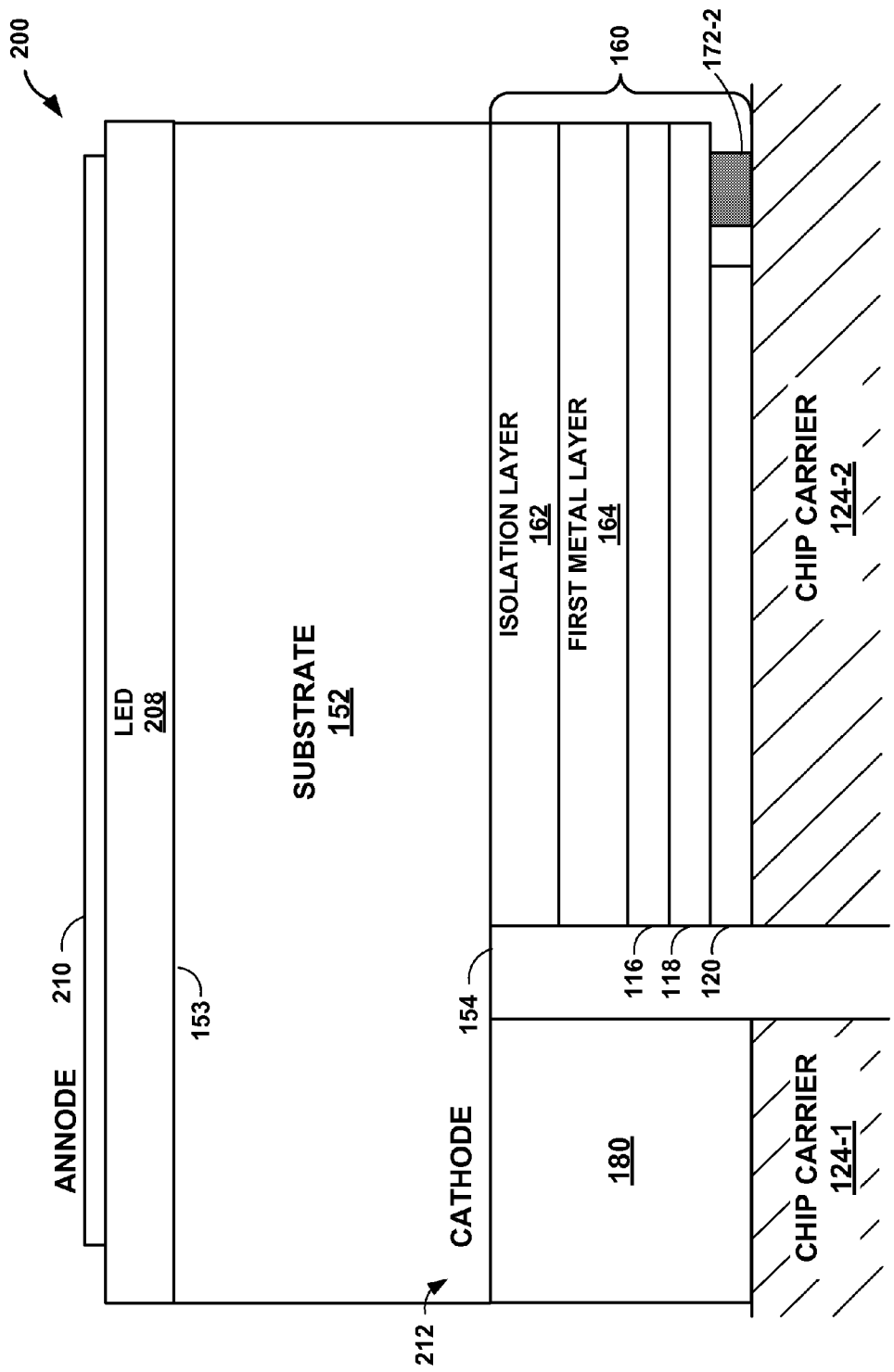
FIG. 5 is a block diagram illustrating an example semiconductor device having a light emitting diode (LED) and a capacitor formed on a back side of the semiconductor device, in accordance with one or more techniques described in this disclosure.

FIG. 5 is a block diagram illustrating an example light emitting diode (LED) 208 and a capacitor 160 formed on a back side 154 of a semiconductor device 200, in accordance with one or more techniques described in this disclosure. FIG. 5 shows a cross-sectional view of semiconductor device 200. Semiconductor device 200 may be used in power applications because it can carry a relatively large current. Features of semiconductor device 200 with the same numbering as that in FIG. 3 or FIG. 4 have similar composition, structure, and functionality of the corresponding features described in FIGS. 3 and 4.

LED 208 is formed on a front side 153 of substrate 152. LED 208 includes an anode 210 and a cathode 212. Current may flow between anode 210 and cathode 212. Capacitor 160 is formed on back side 154 and includes features similar to that of capacitor 160 of FIG. 3.

In one example, two or more semiconductor devices 200 are connected in series (e.g., in chains) to create a panel of LEDs 208. In some applications, a change of LEDs 208 are operated using direct current (DC) voltage. However, LEDs 208 may also be driven with alternating current (AC). In applications where LEDs 208 are operated using AC, zero crossings of the AC voltage may cause LEDs 208 to flicker, which a human eye may detect. Previously, in order to compensate for this so the LEDs do not flicker while being driven with AC voltage, a capacitor may be connected to the chain of LEDs 208, which typically was one large charged bank capacitor connected to the chain of LEDs 208 on an LED driver. The charged bank capacitor would be large and may be too large for a desired microchip package. Further, the charged bank capacitor requires a high voltage in order to provide buffering capacitance to the entire chain of LEDs.

In contrast, according to examples described in this disclosure, each substrate 152 having LED 208 may further include a capacitor 160 formed on the same substrate 152. Capacitor 160 provides a buffering capacitance to LED 208 (or to a different LED in the chain of LEDs 208) such that LED 208 remains on during zero crossings of the AC voltage driving LED 208. The back side capacitor 160 provides a cheaper and smaller way to provide buffering capacitance to LED 208 to prevent it from flickering. As such, capacitor 160 may function as a smoothing capacitor. In some examples, each LED in the chain of LEDs includes a capacitor formed on the back side of the LED substrate. Furthermore, the voltage required for each capacitor 160 to buffer LED 208 may be lower than the voltage required for a single charged bank capacitor.

Figure 6:
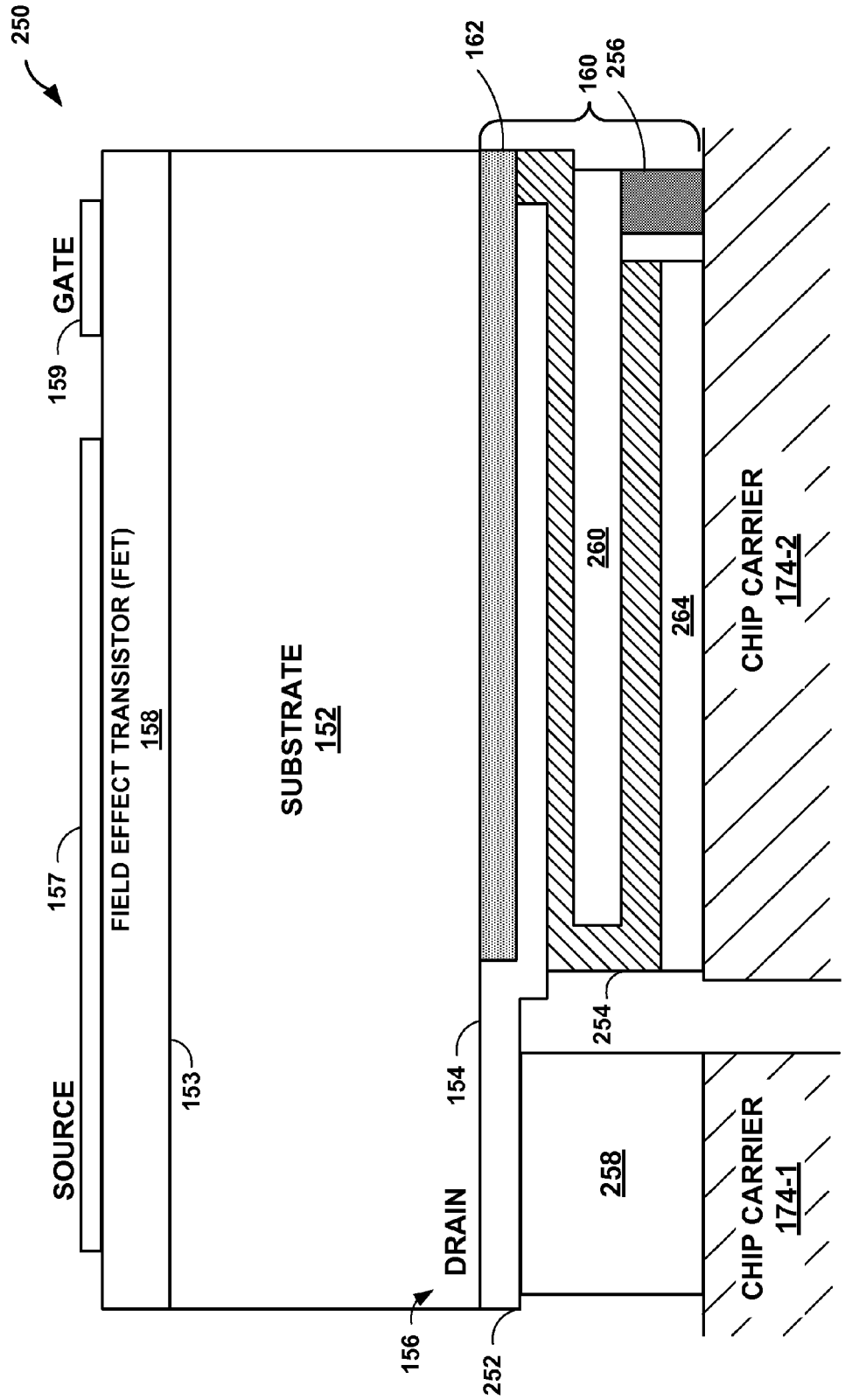
FIG. 6 is a block diagram illustrating another example semiconductor chip including a capacitor formed on a back side of a substrate that is connected to a chip back side electrode, in accordance with one or more techniques described in this disclosure.

FIG. 6 is a block diagram illustrating another example semiconductor chip 250 including a capacitor 160 formed on a back side 154 of a substrate 152 that is connected to a chip back side electrode 258, in accordance with one or more techniques described in this disclosure. Features of semiconductor device 250 with the same numbering as that in FIG. 3 or FIG. 4 have similar composition, structure, and functionality of the corresponding features described in FIGS. 3 and 4.

In the example of FIG. 6, semiconductor chip 250 includes a FET 158 formed on a front side 153, while capacitor 160 is formed on back side 154. However, in this example, capacitor 160 is electrically connected to chip back side electrode 258. As shown, isolating layer 162 is formed on at least a portion of back side 154 of substrate 152. A first metal layer 252 is formed on at least a portion of back side 154 and at least a portion of isolating layer 162. Thus, first metal layer 252 may be directly connected to substrate 152. The portion of back side 154 on which isolating layer 162 is formed may be different than the portion of back side 154 on which first metal layer 252 is formed.

A dielectric layer 254 is formed on at least a portion of isolating layer 162 and at least a portion of first metal layer 252. First metal layer 252 may be a back side metallization (BSM) of back side 154 of substrate 152. The portion of isolating layer 162 on which dielectric layer 254 is formed may be different than the portion of isolating layer 162 on which first metal layer 252 is formed. Dielectric layer 254 may be deposited in one or more steps. A second metal layer 260 may be formed on at least a portion on of dielectric layer 254. An isolation to chip carrier layer 264 is formed on at least a portion of second metal layer 260.

An electrode 256 is formed on at least a portion of second metal layer 260 and provides electrical access to the bottom plate of capacitor 160. A structure 258, which may function as an electrode, is formed on at least a portion of first metal layer 252. Structure 258 connects drain 156 of FET 158 and capacitor electrode 252. Semiconductor chip 250 may also include additional devices than those illustrated in FIG. 6.

Figure 7A:
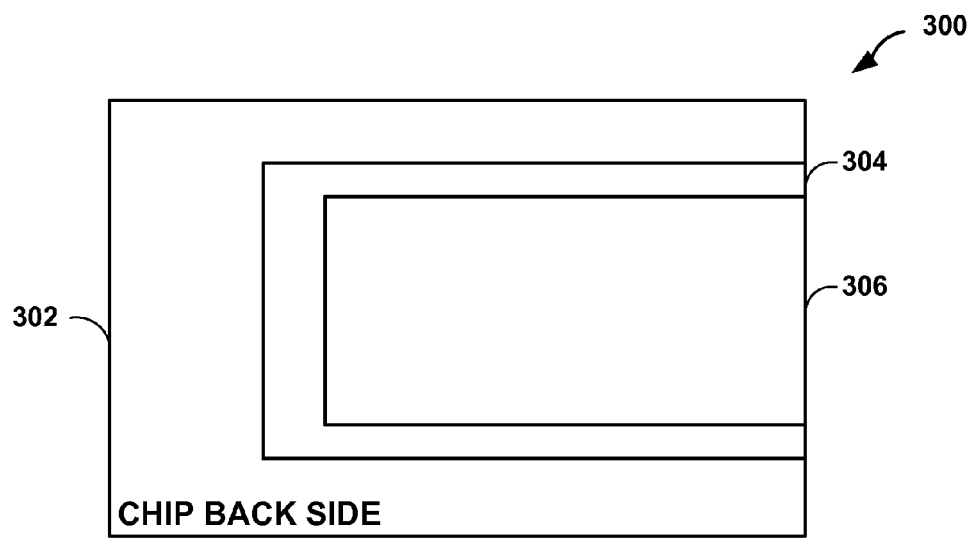
FIGS. 7A and 7B are block diagram illustrating example back sides of semiconductor chips, in accordance with one or more techniques described in this disclosure.
Figure 7B:
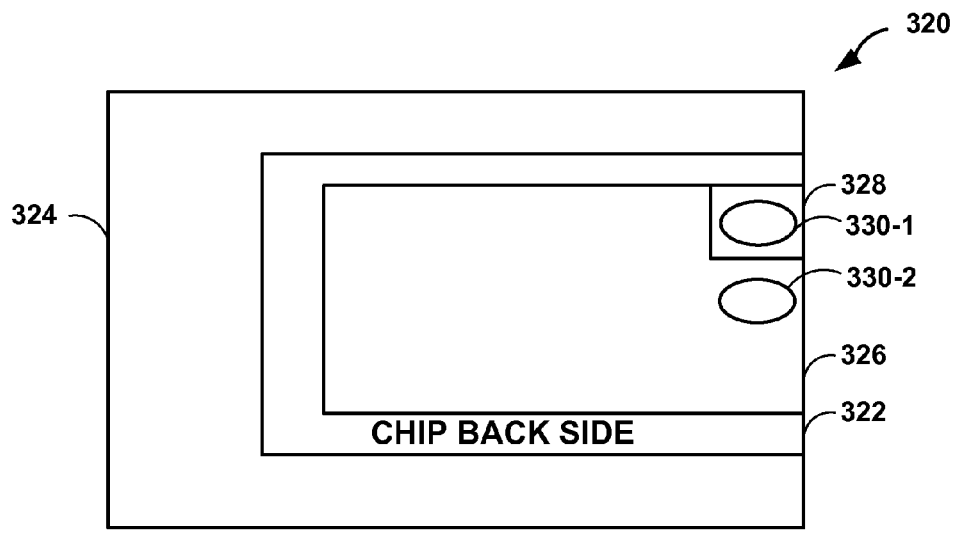

FIGS. 7A and 7B are block diagram illustrating example back sides 300 and 350 of semiconductor chips, in accordance with one or more techniques described in this disclosure. FIGS. 7A and 7B may show back views of the devices described in this disclosure before chip carriers or lead frames are attached.

FIG. 7A illustrates an execution example of the back side partitioning for semiconductor device 150 of FIG. 4. That is, back side 300 of FIG. 7A may be a back side view for semiconductor device 150 of FIG. 4. The different areas of the available surface of back side 302 may be realized by structuring the available surface. FIG. 7A illustrates a chip back side 302. Back side 302 may be a back side of a substrate, such as back side 154 of substrate 152. Back side 302 provides an area for a drain of the chip, such as drain 156 of FET 158 of FIG. 4.

Back side 300 further illustrate electrode 304. Electrode 304 may be a first connection point of a capacitor. For example, electrode 304 is electrode 172-1 that provides an electrical connection to the top plate, first metal layer 164, of capacitor 160. The size and shape of electrode 304 may be approximately equivalent to an area of capacitor 160. Back side further illustrates electrode 306. Electrode 306 may be a second connection point of a capacitor. For example, electrode 306 is electrode 172-2 that provides an electrical connection to the bottom plate, second metal layer 168, of capacitor 160. In other examples, other regions and configurations are possible.

FIG. 7B illustrates an execution example of the back side partitioning for semiconductor device 200 of FIG. 5. That is, back side view 320 of FIG. 7B may be a back side view for semiconductor device 200 of FIG. 5. FIG. 7A illustrates a chip back side 322. Back side 322 may be a back side of a substrate, such as back side 154 of substrate 152. Different layers or feature may be formed on back side 322. For example, cathode area 324 may include one or more layers and is formed on back side 322. Cathode area 324 provides an area for a cathode of the chip, such as cathode 212 of LED 208 of FIG. 5. Cathode area 324 may correspond to structure 180 of FIG. 5.

Back side view 320 further illustrates isolation to chip carrier layer 326. Isolation to chip carrier layer 326 may correspond to isolation layer 120 of FIG. 5. The size and shape of isolation to chip carrier layer 326 may be approximately equivalent to an area of capacitor 160. FIG. 7B further illustrates an area isolation to chip carrier layer 326 (e.g., layer 120 of FIG. 5) was not formed on a first metal layer 328 (e.g., first metal layer 164 of FIG. 5).

Back side view 320 further illustrates two electrodes, 330-1 and 330-2. Electrode 330-1 may electrically connect to first metal layer 328 and function as a first connection point of a capacitor. For example, electrode 330-1 connects to first metal layer 164 of FIG. 5. That is, electrode 330-1 provides an electrical connection to the top plate, first metal layer 164, of capacitor 160. Moreover, electrode 330-2 may be a second connection point of a capacitor. For example, electrode 330-2 is electrode 172-2 in FIG. 5 and provides an electrical connection to the bottom plate, second metal layer 168, of capacitor 160. In other examples, other regions and configurations are possible.

Figure 8:
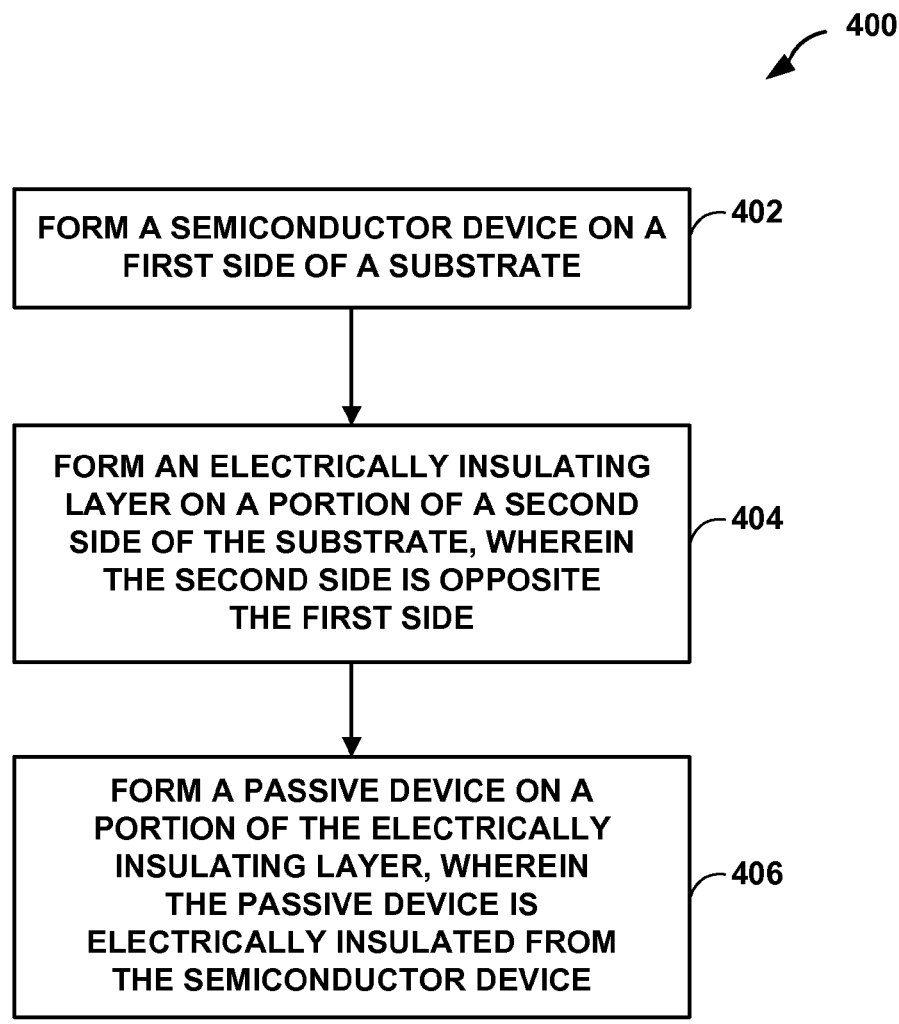
FIG. 8 is a flowchart illustrating an example method for forming a semiconductor device, in accordance with one or more techniques described in this disclosure.

FIG. 8 is a flowchart illustrating an example method 400 for forming a semiconductor device, in accordance with one or more techniques described in this disclosure. The example method 400 may be employed to form any of the devices and techniques illustrated in this disclosure.

Method 400 includes forming a semiconductor device on a first side of a substrate (402). Front side processing may be used to form the semiconductor device on the first side of a substrate. For example, front side processing may be used to form active device 6, active device 108, FET 158, and LED 208 of FIGS. 1 and 3-6, respectively.

Method 400 further includes forming an electrically insulating layer on at least a portion of a second side of the substrate, wherein the second side is opposite the first side (404). For example, electrically insulating layer 10 of FIG. 1 may be formed on back side 22 of substrate 4. In some examples, the backside structure may be aligned with the structure on the front side.

Additionally, method 400 includes forming a passive device on at least a portion of the electrically insulating layer, wherein the passive device is electrically insulated from the semiconductor device (406). In some examples, the electrically insulating layer is an oxide layer.

In some examples, method 400 further includes attaching one or more chip carrier portions to the passive device such that the passive device is electrically insulated from the semiconductor device. In some examples, one or more lead frames may be attached to the back side of the chip. A lead frame may be partially etched before attaching to a chip backside, such as an isolation to chip carrier layer. For example, one side of the lead frame may be etched into an appropriate trace structure for making electrical connections to the semiconductor device. During the manufacturing process, the other side of the lead frame may be etched as desired. The size of the traces may depend on the voltage of the anticipated application for the chip.

In some examples, method 400 further includes forming a capacitor on the back side of the chip. Method 400 may include, for example, forming a first metal layer on at least a portion of the electrically insulating layer. Method 400 may further include forming a dielectric layer on at least a first portion of the first metal layer and forming a second metal layer on at least a portion of the dielectric layer. Method 400 may also include forming an isolation layer formed on at least a first portion of the second metal layer.

In some examples, method 400 may further include a layer stack over at least a portion of a second portion of the second side of the substrate. Method 400 may also include forming a first electrode on at least a second portion of the first metal layer and forming a second electrode on a second portion of the second metal layer. Further, method 400 may include mechanically coupling a first portion of a chip carrier to at least a portion of the layer stack and mechanically coupling a second portion of the chip carrier to the first electrode. Method 400 may also include mechanically coupling a third portion of the chip carrier to at least a portion of the isolation to chip carrier layer and the second electrode, wherein the first, second, and third portions of the chip carrier are electrically isolated from each other.

In another example, method 400 includes forming a metal layer on at least a portion of the oxide layer and on at least a second portion of the second side of the substrate. Method 400 may include forming a layer stack over at least a second portion of the metal layer, wherein the second portion of the metal layer is on the second portion of the second side of the substrate.

In some examples, method 400 includes creating a trench layer structure. First, trenches may be etched into the substrate, such as substrate 50 of FIG. 2B. The trenches may be formed using a lithography trenching process, such as anisotropic etching process, dry etching process, or the like. Next, the trenches are filled with an oxide layer to create first isolation layer, such as first isolation layer 56. In some regions, the oxide layer may be etched further to create direct electrical connections to the chip back side. Some of first isolation layer 56 is etched away to keep the trench structure. Then, the additional layers are conformally deposited on the etched first isolation layer. For example, layers 58, 60, and 62 of capacitor 66 are formed approximately conformally using sputtering techniques, for example. Finally, second isolation layer, such as second isolation layer 64, is deposited on the previous layer, which may fill the trenches.

Any processing on the back side of the substrate may be done using front side processing techniques. For example, front side processing may be used to form electrically insulating layer 10 of FIG. 1. That is, techniques of the disclosure may utilize technology and tools that are used in forming front end devices to structure the back side of a chip and to produce a capacitor with the structure on the back side.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about," "approximate," or the like indicates that the value listed may be somewhat altered, as long as the alteration does not result in nonconformance of the process or structure to the illustrated example.

Terms of relative position as used in this disclosure are defined based on a plane parallel to the conventional plane or working surface of a wafer or substrate, regardless of the orientation of the wafer or substrate. The term "horizontal" or "lateral" as used in this disclosure is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

Various examples and techniques have been described. Aspects or features of examples described herein may be combined with any other aspect or feature described in another example. These described examples and other examples are within the scope of the following claims.

What is claimed is:

1. A semiconductor chip comprising:
   a substrate including a first side and a second side, wherein the second side is opposite the first side;
   a semiconductor device formed on the first side of the substrate;
   an electrically insulating layer formed on at least a portion of the second side of the substrate;
   a passive device formed on at least a portion of the electrically insulating layer on the second side of the substrate, wherein the passive device is electrically insulated from the semiconductor device; and
   a chip carrier including a first portion and a second portion, wherein the first portion is electrically isolated from the second portion, and wherein the chip carrier comprises an electrically conductive material.

2. The semiconductor chip of claim 1, wherein at least a section of the first portion of the chip carrier is directly mechanically coupled to the passive device, the semiconductor chip further comprising:
a first electrode electrically coupled to a first plate of the passive device, wherein the first electrode is mechanically affixed to the first portion of the chip carrier; and
a second electrode electrically coupled to a second plate of the passive device, wherein the second electrode is mechanically coupled to the second portion of the chip carrier.

3. The semiconductor chip of claim 1, wherein the electrically insulating layer comprises an oxide layer, and wherein the passive device is a capacitor device and further comprises:
a first metal layer formed on at least a portion of the oxide layer;
a dielectric layer formed on at least a portion of the first metal layer;
a second metal layer formed on at least a portion of the dielectric layer; and
an isolation to chip carrier layer formed on at least a portion of the second metal layer.

4. The semiconductor chip of claim 3, wherein the semiconductor device is a field effect transistor configured to have current flow approximately between the first side and the second side of the substrate, and wherein the portion of the second side of the substrate is a first portion of the second side of the substrate.

5. The semiconductor chip of claim 4, wherein the portion of the first metal layer is a first portion of the first metal layer, wherein the portion of the second metal layer is a first portion of the second metal layer, the semiconductor chip further comprising:
a layer stack formed over at least a portion of a second portion of the second side of the substrate;
a first electrode formed on at least a second portion of the first metal layer;
a second electrode formed on a second portion of the second metal layer;
a first portion of a chip carrier mechanically coupled to at least a portion of the layer stack;
a second portion of the chip carrier mechanically coupled to the first electrode; and
a third portion of the chip carrier mechanically coupled to at least a portion of the isolation to chip carrier layer and the second electrode, wherein the first, second, and third portions of the chip carrier are electrically isolated from each other.

6. The semiconductor chip of claim 4, wherein the portion of the second side of the substrate is a first portion of the second side of the substrate, wherein the first metal layer is formed on at least a second portion of the second side of the substrate, the semiconductor chip further comprising:
a layer stack formed over at least a second portion of the first metal layer, wherein the second portion of the first metal layer is formed on the second portion of the second side of the substrate.

7. The semiconductor chip of claim 1, wherein the semiconductor device is at least one of a light emitting diode (LED), a field effect transistor (FET), and a vertical FET.

8. The semiconductor chip of claim 1, wherein the passive device has a trench structure.

9. A semiconductor chip comprising:
a substrate including a first side and a second side, wherein the second side is opposite the first side;
a semiconductor device formed on the first side of the substrate;
an electrically insulating layer formed on at least a portion of the second side of the substrate;
a passive device formed on at least a portion of the electrically insulating layer on the second side of the substrate, wherein the passive device is electrically insulated from the semiconductor device; and
a lead frame mechanically coupled to the semiconductor device and the passive device such that the semiconductor device and the passive device are electrically isolated from each other.

10. The semiconductor chip of claim 1, wherein the portion of the electrically insulating layer is a first portion of the electrically insulating layer, and wherein the passive device is a first passive device, the semiconductor chip further comprising:
a second passive device formed on at least a second portion of the electrically insulating layer on the second side of the substrate, wherein the second passive device is electrically insulated from the semiconductor device and the first passive device.

11. A semiconductor chip package comprising:
a substrate including a first side and a second side, wherein the second side is opposite the first side;
a semiconductor device formed on the first side of the substrate;
an electrically insulating layer formed on at least a portion of the second side of the substrate;
a capacitor device formed on at least a portion of the electrically insulating layer on the second side of the substrate, wherein the capacitor device is electrically insulated from the semiconductor device; and
a chip carrier including at least a first portion and a second portion, wherein the first portion is electrically isolated from the second portion, and wherein the chip carrier comprises an electrically conductive material.

12. The semiconductor chip package of claim 11, wherein at least a section of the first portion of the chip carrier is directly mechanically coupled to the capacitor device, the semiconductor chip package further comprising:
a first electrode electrically coupled to a first plate of the capacitor device, wherein the first electrode is mechanically affixed to the first portion of the chip carrier; and
a second electrode electrically coupled to a second plate of the capacitor device, wherein the second electrode is mechanically coupled to the second portion of the chip carrier.

13. The semiconductor chip package of claim 11, wherein the semiconductor device is a field effect transistor configured to have current flow approximately between the first side and the second side of the substrate, wherein the portion of the second side of the substrate is a first portion of the second side of the substrate, wherein the electrically insulating layer comprises an oxide layer, and wherein the capacitor device further comprises:
a first metal layer formed on at least a portion of the oxide layer;
a dielectric layer formed on at least a portion of the first metal layer;
a second metal layer formed on at least a portion of the dielectric layer; and
an isolation layer formed on at least a portion of the second metal layer.

14. The semiconductor chip package of claim 13, wherein the portion of the first metal layer is a first portion of the first metal layer, and wherein the portion of the second metal layer is a first portion of the second metal layer, the semiconductor chip further comprising:

a layer stack formed over at least a portion of a second portion of the second side of the substrate, wherein the first portion of the chip carrier is mechanically coupled to at least a portion of the layer stack;

a first electrode formed on at least a second portion of the first metal layer, wherein the second portion of the chip carrier is mechanically coupled to the first electrode;

a second electrode formed on a second portion of the second metal layer; and a third portion of the chip carrier mechanically coupled to at least a portion of the isolation to chip carrier layer and the second electrode, wherein the first, second, and third portions of the chip carrier are electrically isolated from each other.

15. The semiconductor chip package of claim 13, wherein the portion of the second side of the substrate is a first portion of the second side of the substrate, wherein the first metal layer is formed on at least a second portion of the second side of the substrate, the semiconductor chip further comprising:

a layer stack formed over at least a portion of the second metal layer, wherein the portion of the second metal layer is formed on the second portion of the second side of the substrate.

16. The semiconductor chip package of claim 11, wherein the semiconductor device is a first light emitting diode (LED), the semiconductor chip package further comprising:

an anode of the first LED formed on one of the first side or the second side of the substrate, wherein the anode is configured to electrically connect to a cathode of a second LED; and a cathode of the first LED formed on the opposite side of the substrate that the anode is formed on, wherein the cathode is configured to electrically connect to an anode of a third LED.

* * * * *